(12) United States Patent
Koshikawa

(10) Patent No.: US 6,353,573 B1
(45) Date of Patent: Mar. 5, 2002

(54) CLOCK SYNCHRONIZATION SEMICONDUCTOR MEMORY DEVICE

(75) Inventor: Yasuji Koshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/568,348

(22) Filed: May 10, 2000

(30) Foreign Application Priority Data

May 14, 1999 (JP) .......................................... 11-133904

(51) Int. Cl.[7] ................................................ G11C 8/00
(52) U.S. Cl. ..................... 365/233; 365/194; 365/238.5; 365/203
(58) Field of Search ............................... 365/193, 194, 365/233, 203, 238.5

(56) References Cited

U.S. PATENT DOCUMENTS 5,031,150 A * 7/1991 Ohsawa ....................... 365/193
6,192,003 B1 * 2/2001 Ohta et al. .................... 365/233

FOREIGN PATENT DOCUMENTS

JP 10-64269 3/1998

* cited by examiner

*Primary Examiner*—Son Mai

(57) ABSTRACT

A clock synchronization semiconductor memory device in which the pre-charging time tRP can be accelerated by the variable delay time for write recovery. There is provided a unit for checking whether or not at least one clock cycle before the inputting of the pre-charge command is that for the write operation, and for holding the checked result. There is also provided a unit for performing switching control at the time of inputting the pre-charge command, responsive to the checked result, as to whether or not a pre-set delay time is to be introduced as from the time of inputting the pre-charge command until word line resetting.

8 Claims, 15 Drawing Sheets

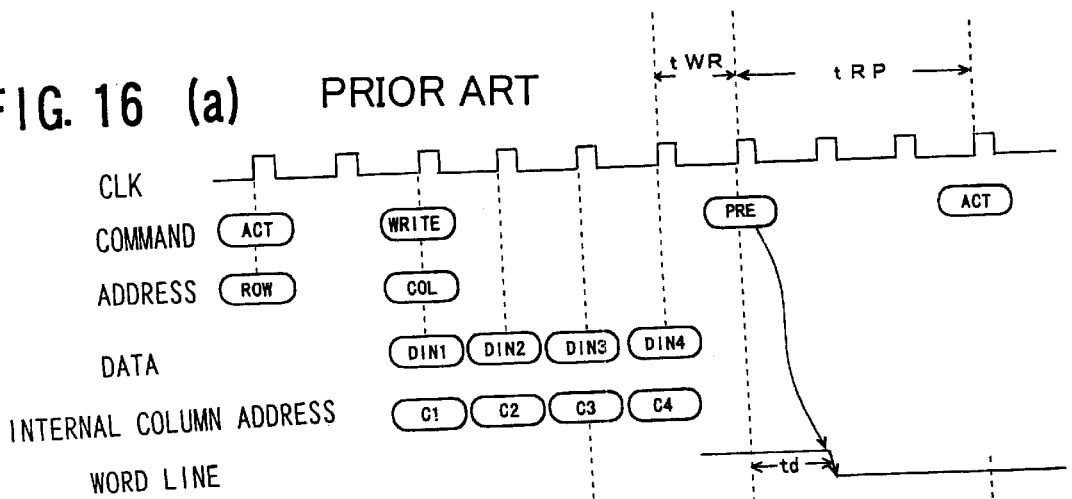
FIG. 16 (a) PRIOR ART
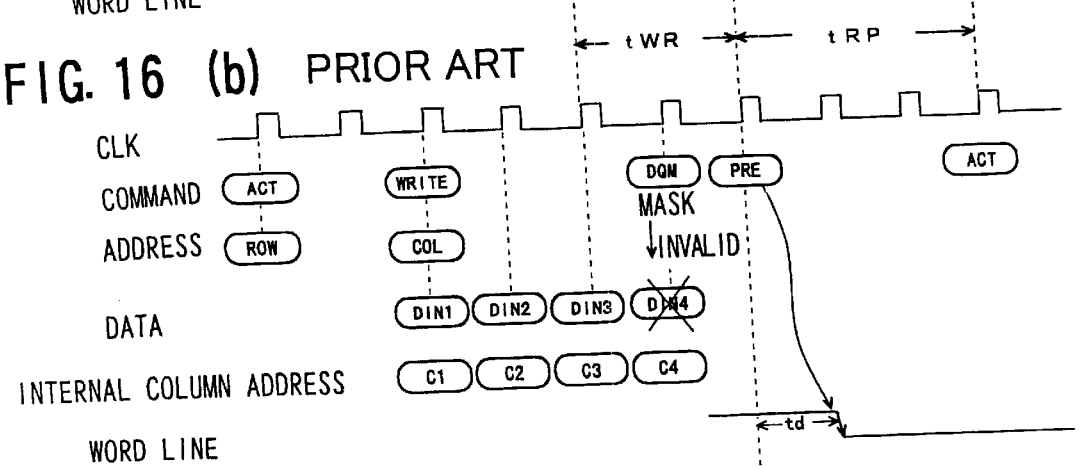
FIG. 16 (b) PRIOR ART

CLOCK SYNCHRONIZATION SEMICONDUCTOR MEMORY DEVICE

FIELD OF THE INVENTION

This invention relates to a semiconductor memory device and, more particularly, to a clock synchronization semiconductor memory device.

BACKGROUND OF THE INVENTION

In keeping up with the increasing operating frequency of a CPU, there is raised a demand for increasing the operating speed of a semiconductor memory device, such as a dynamic random access memory (DRAM). In order to meet this demand, a synchronization semiconductor memory device operating in synchronism with the external clocks exceeding 100 MHz, with a clock Period being tCK<10 ns, has made its debut. In the clock synchronization semiconductor memory device, the input/output and the operating timing of a-variety of control circuits are control led by clocks supplied from outside to enable operational control by commands (signal combination) and burst read/burst write with continuous accessing.

In the semiconductor memory device, when data is written from a writing circuit through a digit line in a memory cell selected on the memory cell array, a pre-set delay time is provided after the writing. After this delay time, pre-charging (with equalizing) from a pre-charging circuit to a digit line is executed to set the digit line at a pre-set potential. The pre-charging is executed after the pre-set delay as from the writing in order to prevent inputting of incorrect data which tends to occur if the pre-charging is executed before writing data in the memory cell. For the write recovery period of time, reference is made to, for example, the disclosure of the JP Patent Kokai JP-10-64269, the entire relevant disclosure thereof being incorporated herein by reference thereto.

In the case of the clock synchronization semiconductor memory device, the cycle from a clock (timing) at the last data writing until a clock (timing) of inputting a pre-charge command represents a write recovery period tWR, e.g., upon burst writing (likewise upon single writing). A digit line is pre-charged by inputting a pre-charge (PRE) command using a combination of control signals from an external terminal, whilst a word line is reset by resetting a row address line.

Thereupon, the reset timing of the internal row address strobe signal (RASB), that is the transition timing from the Low level to the High level, is delayed by a delay circuit, so that the word line connected to the memory cell will be reset after inputting the pre-charging command and subsequent data writing in a selected memory cell, whereby adjusting is performed on the timing of resetting of the word line selectively driven by an X-decoder (transition from the High level to the Low level).

Referring first to FIG. 13, schematics of an illustrative structure of an example of a conventional synchronous DRAM, as a clock synchronization semiconductor memory device, are explained. Meanwhile, in FIG. 13, those elements not directly related with the subject matter of the present invention, for example, a bank structure of a DRAM core, column address counter for burst control, burst length, burst type, CAS latency, mode register for storing an operational code or a refresh control circuit etc. are not shown for simplicity.

Referring to FIG. 13, the conventional synchronization DRAM includes a command decoder 11, which is fed with control signals from a row address strobe (RAS) terminal, a column address strobe (CAS) terminal, a write enable (WE) terminal and a chip select (CS) terminal, as output terminals, and which decodes commands from combinations of values of these control signals; an internal clock generating circuit 10 that generates an internal clock signal I CLK from an external clock signal input to a clock input (CLK) terminal; a mask signal generating circuit 12 that generates an internal DQM signal (signal controlling the masking of an input signal and output enable) based on a DQM signal fed from an input mask/ output enable (DQM) terminal; an internal address signal generating circuit 13 that inputs and buffers an address signal, selects a bank and outputs an internal address signal; an input/output circuit 14 that receives data from a data input/output (DQ) circuit and outputs data to the DQ terminal; an internal row address strobe signal generating circuit (internal RASB signal generating circuit) 15 that outputs an internal row address strobe (RASB) signal; a word line timing adjustment circuit 16; a CAS (column address strobe) control circuit 17, fed with an internal clock signal ICLK, a READ signal from the command decoder 11 and a write burst signal WBST; a RAS (row address strobe) control circuit 18, fed with the internal clock signal I CLK and an internal RASB signal; an X-decoder (XDEC) 19 fed with a row address from the internal address signal generating circuit 13 to decode the row address to select a word line; and a Y-decoder (YDEC) 20 fed with a column address from the internal address signal generating circuit 13 to decode the column address to select a digit line of a memory cell array.

An ACT (bank active) signal output from the command decoder 11 and a PRE (pre-charging) signal, output by the command decoder 11. are input to the internal RASB signal generating circuit 15 where an internal RASB signal is generated. Meanwhile, bank selection by a pre-set bit or bits of an address signal is made upon a bank active (ACT) command. After this ACT command, commands of read (READ), write (WRITE) and pre-charging (PRE) are executed.

This internal RASB signal generating circuit 15 is constituted by e.g., a set-reset (SR) latch circuit, such that, if an ACT signal is asserted, the internal RASB signal is rendered active (low-level), whereas, if the pre-charging (PRE) signal is asserted, the internal RASB signal, which has so far been active, is reset to an inactive (high-level) state.

This internal RASB signal is input to the word line timing adjustment circuit 16, which then generates an RAS3B (third row address strobe) signal controlling the word line strobe timing to supply the generated RAS3B signal to the X-decoder 19. The X-decoder decodes a row address signal to select a word line. If the RAS3B signal is turned active, the X-decoder 19 activates the selected word line, whereas, if the RAS3B signal is active, the X-decoder 19 resets the row address to reset the word line.

FIG. 14 schematically shows an illustrative structure of a memory cell array 21. A memory cell array transistor 22, connected to digit line pairs (D/DB_1, D/DB _2, ... ) has its gate connected to a word line from the X-decoder 19. The digit line pairs are connected to a readout/write circuit (sense amplifier) 23 through a column switch on/off controlled by a column selection line from the Y-decoder 20. The readout/ write circuit 23 is connected through an I/O line (read/write data bus) to the input/output circuit 14. In FIG. 14, 24 is a pre-charging equalizer circuit of the digit line pair receiving signals from the RAS (row address strobe) control circuit 18 of FIG. 13 to pre-charge and equalize the digit line Pairs. Here, the pre-charge potential of the digit line pairs (D/DB_

1, D/DB_2, . . . ) is at an intermediate level of the power source potentials (amplitude of the digit line).

The word line timing adjustment circuit, configured as shown in FIG. 15, outputs the input internal RASB signal, which has turned low from the high level, at the same time, that is without delay, while outputting the internal RASB signal, which has turned high from the low level by the assertion of the PRE-signal, as a signal RAS3B delayed by delay time td provided by the delay circuit 301.

The X-decoder 19 is responsive to the resetting from the low level to the high level of this RAS3B signal to reset the row address. As a result, the selected word line is also reset from the high level to the low level to render the memory cells nonselected.

FIG. 16, illustrating schematics of the operation of the clock synchronization type semiconductor memory device, schematically shows the timing operation of a synchronous DRAM with a burst length equal to 4 clocks. That is, FIG. 16 schematically shows an external CLK terminal, a command, address, input data, an internal column address and a word line, in the sequence of operations of the bank active (ACT) command, called an "ACT command", a write (WRITE) command, pre-charge command, called a "PRE-command", and a bank active command.

In FIG. 16(a), a write recovery period (tWR) is one clock cycle. When the PRE-command is entered, the PRE-signal turns active and the internal RASB signal goes to a high level, whereupon a signal delayed by a delay time td by a delay circuit 301 in the word line timing adjustment circuit 16 is output as an internal RAS3B signal, thereby to adjust the falling timing from the high level to the low level of the word line so as to reset the word line after the end of the write operation in the memory cell.

SUMMARY OF THE DISCLOSURE

In the course of intense investigations toward the present invention, the following problems have been encountered. In the following a detailed analysis on the problems in the prior art will be given.

Meanwhile, as the operating frequency is increased to e.g 100 MHz, the clock period tCK is shortened, such that, as the p pre-charging period (tRP) of pre-charging the digit line, three clock cycles, for example, are required, as shown in FIG. 16(a).

In this case, if two clock cycles, for example, are taken as the write recovery period (tWR) in place of one clock cycle, the pre-charging period tRP remains unchanged, that is, it is three clock cycles. The last data DIN4 during burst writing, for example, is masked by the DQM signal, as shown in FIG. 16(b), with the write recovery period (tWR) being two clock cycles (2tCK). However, even in this case, a word line is reset after delay of the delay time (td) of the delay circuit 301 in the word line timing adjustment circuit 16 as from the time of inputting of the PRE-command, such that the pre-charging period tRP is three clock cycles, whilst it cannot be set to two clock cycles.

It is because the configuration is such that, even when the write operation for the memory cell has come to a close one clock cycle before the time point of inputting the PRE-command, the word line is reset after the delay td in the delay circuit 301 of the word line timing adjustment circuit 16 as from the time of inputting the PRE-command, such that the pre-charging of the digit line takes place after resetting of the selected word line, this delay time td being dragged (shifted) into the next following pre-charging period tRP.

Consequently, even when the write recovery period (tWP) is two clock cycles, it is not possible with the conventional synchronous DRAM to speed up the pre-charging period tRP.

Recently, there are raised a demand to use the synchronous DRAM with a write recovery period tWP=2 clock cycles and with a pre-charging Period tRP=2 clock cycles and another demand to use the synchronous DRAM with a write recovery period tWP=1 clock cycle and with a pre-charging period tRP=3 clock cycles, in meeting with a user application system.

However, with the above-described conventional synchronous DRAM, the pre-charging period tRP=three clock cycles needs to be maintained even in case with the write recovery period tWR=2 clock cycles, so that the above-mentioned demands by the user cannot be met with a sole synchronous DRAM chip. If the two demands are to be met, two sorts of the synchronous DRAM products need to be developed, thereby increasing the manufacturing cost of the semiconductor memory device.

In view of the above problems, it is a principle object of the present invention to provide a semiconductor memory device with which it is possible to speed up the pre-charging period (tRP).

It is another object of the present invention to provide a semiconductor memory device which realizes two modes, one mode being the write recovery period tWR=2 clock cycles with the pre-charge period tRP=2 clock cycles and the other being the write recovery period tWR=1 clock cycle with the pre-charge period tRP=3 clock cycles.

It is Yet another object of the present invention to provide a semiconductor memory device with which it is possible to speed up the RAS/CAS delay time as from a time point of inputting an active command until the inputting of a read command. Other objects and features of the present invention will become clear by the following description and the claims.

For accomplishing the above object, according to a first aspect of the present invention there is provided a clock synchronization semiconductor memory device comprising a variable control circuit (or in general, means for) variably controlling a period of time as from a time point of inputting a pre-charge command until resetting of a word line based on outcome of a determination as to whether or not a clock cycle at least one clock cycle before the time point of inputting a pre-charge command was under a write operation (i.e., corresponds to the timing of the write operation).

According to a second aspect, control is Performed so that, if the write recovery time tRP is used at two clock cycles, the falling timing from the High to the Low level of the word line after inputting a pre-charging command is quickened, whereas, if the write recovery time tWR is used at one clock cycle, the falling timing from the High to the Low level of the word line after inputting a pre-charging command is delayed.

According to a third aspect, the present invention also includes a variable control circuit (or, generally, means for) variably controlling a period of time as from inputting of a bank active command until activating a word line based on the results of check as to whether or not an internal row address strobe signal a pre-set number of clock cycles before the inputting of a bank active command is active.

According to a fourth aspect, the present invention is configured to perform control for checking (determining) whether or not a pre-charge command has been input a pre-set number of clock cycles before the time point of inputting of a bank active command. A switching control unit immediately activates a selected word line at a time points of inputting a bank active command if the pre-charge command is input the pre-set number of clock cycles before the time point of inputting the bank active command, to shorten the RAS/CAS (row address strobe/column address strobe) delay period tRCD as from the time point of inputting the bank active command until inputting a read command. On the other hand, the switching control unit activates the selected word line with a pre-set delay time as from the time point of inputting the bank active command if the pre-charging command is input the pre-set number of clock cycles before the time point of inputting the bank active command, to elongate the RAS/CAS (row address strobe/column address strobe) delay period tRCD as from the time point of inputting the bank active command until the inputting of the read command.

According to a fifth aspect, there is provided a clock synchronization semiconductor memory device comprising:

a determination circuit that determines whether or not a clock cycle at least one clock cycle before the time point of inputting the pre-charge command was under to a write operation; and a variable control circuit that variably controls a period of time as from a time point of inputting a pre-charge command until resetting of a word line based on outcome of the determination means.

According to a 6th aspect, the clock synchronization semiconductor memory device comprises:

means for providing a pre-set delay time as from a time point of inputting a pre-charging command until resetting a word line, if the clock cycle at least one clock cycle before inputting a pre-charge command is under a write operation; and switching controlling means for resetting the word line immediately in case the clock cycle at least one clock cycle before inputting the pre-charge command is not under the write operation.

According to a 7th aspect of the clock synchronization semiconductor memory device comprises:

a switching circuit that controls between introducing and not introducing a pre-set delay during the time as from a time point of inputting the pre-charge command until resetting of a word line, based on the state of an internal write enable signal during a clock cycle at least one clock cycle before inputting the pre-charge command.

According to an 8th aspect, the clock synchronization semiconductor memory device comprises:

checking means for checking whether or not a clock cycle at least one clock cycle before inputting a pre-charge command corresponds to a write operation;

means for storing results of the checking; and means for variably controlling a period of time as from a time point of inputting a pre-charge command until resetting of a word line, at the time point of the inputting of the pre-charge command, responsive to the checked results.

According to a 9th aspect, the clock synchronization semiconductor memory device comprises:

checking means for checking whether or not a clock cycle at least one clock cycle before inputting a pre-charge command corresponds to a write operation and for storing results of checking;

time-delay means for providing a pre-set delay time as from a time Point of inputting a pre-charging command until resetting a word line if the results of check indicate that the clock cycle at least one clock cycle before inputting a pre-charge command corresponds to a write operation; and a switching controlling means for resetting the word line immediately in case the results of check indicate that the clock cycle at least one clock cycle before inputting a pre-charge command does not correspond to a write operation.

According to a 10th aspect, the clock synchronization semiconductor memory device comprises:

checking means for checking whether or not the clock cycle at least one clock cycle before inputting a pre-charge command corresponds to a write operation, and also whether or not the input data is set to a masked state; and switching controlling means for switching-controlling between introducing and not introducing a pre-set delay time as from a time point of inputting a pre-charging command until resetting a word line, at the time of inputting a pre-charging command, responsive to checked results of the checking means.

According to an 11th aspect, the clock synchronization semiconductor memory device comprises:

(a) a command decoder that decodes a command from a combination of control signals;

(b) an internal row address strobe signal generating circuit that generates an internal row address strobe signal responsive to inputting of a pre-charge signal supplied from the command decoder and a bank active signal; and (c) a word line timing adjustment circuit that generates and outputs a word line strobe control signal configured to control strobe timing of a word line responsive to inputting of the row address strobe signal;

(d) the word line in the activated state being reset to an inactive state on transition of the word line strobe control signal from an active state to an inactive state;

(cc) the word line timing adjustment circuit comprises:

(c1) a delay circuit that receives the internal row address strobe signal and outputs the input signal with a delay; and (c2) a switching control circuit that receives the row address strobe signal and a delayed output signal from the delay circuit and performs control responsive to a logical value of an internal write enable signal one clock cycle before as to whether or not transition from an active to an inactive state of the word line strobe control signal is to be delayed;

(c3) the switching control circuit setting a timing of transition from an active state to an inactive state of the word line strobe control signal to a timing delayed a delay time in the delay circuit from a timing of transition from the active state to the inactive state of the input row address strobe signal, if a value of the internal write enable signal one clock cycle before the inputting of the pre-charge command is active;

(c4) the control circuit performing switching control so that, if the value of the internal write enable signal one clock cycle before the inputting of the pre-charge command is inactive, the timing of transition of the word line strobe control signal from the active state to the inactive state is of the same timing as the timing of transition of the input row address strobe signal from the active state to the inactive state.

According to a 12th aspect, the clock synchronization semiconductor memory device comprises:

(a) a command decoder that decodes a command from a combination of control signals;

(b) an internal row address strobe signal generating circuit that generates an internal row address strobe signal responsive to inputting of a pre-charge signal output by the command decoder and a bank active signal; and (c) a word line timing adjustment circuit that generates and outputs a word line strobe control signal controlling the strobe timing of a word line responsive to inputting of the row address strobe signal;

(d) the word line in an activated state being reset to an inactive state on transition of the word line strobe control signal from an active state to an inactive state; wherein;

(cc) the word line timing adjustment circuit comprises:

(c1) a delay circuit that receives the internal row address strobe signal and outputs the same with a delay as a delayed output signal;

(c2) a latch circuit that receives a line burst signal and a data mask signal and outputs and holds an active signal synchronous with internal clock signals only when the write burst signal is active and the data mask signal is inactive, with input data not being masked;

(c3) a first logic circuit that receives (i) an inversed signal of a delayed output signal from the delay circuit and (ii) an output signal of the latch circuit, as inputs, the first logic circuit outputting the delayed output signal of the delay circuit when an output signal of the latch circuit is active, the first logic circuit outputting a fixed value to mask the delayed output signal of the delay circuit when the output signal of the latch circuit is inactive; and (c4) a second logic circuit that receives the internal row address strobe signal output by the internal row address strobe signal generating circuit and an output signal of the first logic circuit, the second logic circuit operating responsive to the value of the output signal of the first logic circuit:

(i) either to output a signal transition of which from active to inactive is of the same timing as transition from active to inactive of the internal row address strobe signal, as the word line strobe control signal, or (ii) to output, as the word line strobe control signal, a signal transition of which from active to inactive is delayed a delay time at the delay circuit from the transition timing of the internal row address strobe signal from active to inactive.

According to a 13th aspect, in the clock synchronization semiconductor memory device aforementioned with respect to 5th to 12th aspects, the control is performed by switching over between first and second modes:

(1) the first mode being performed if a clock cycle immediately before the inputting of a pre-charge command is not a write operation, such that a write recovery time period is switched to two clock cycles and a pre-charge period is switched to two clock cycles; and (2) the second mode being performed if a clock cycle immediately before the inputting of a pre-charge command is a write operation, such that the write recovery time period is switched to one clock cycle and the Pre-charge period is switched to three clock cycles.

According to a 14th aspect, the clock synchronization semiconductor memory device comprises:

(a) a determination circuit that checks as to whether or not an internal row address strobe signal a pre-set number of cycles before an inputting of a bank active command is active; and (b) a variable control circuit that variably controls a period of time as from the inputting of a bank active command until activating a word line based on results of the checking.

According to a 15th aspect, the clock synchronization semiconductor memory device comprises:

(a) determination means for checking whether or not a pre-charge command has been input a pre-set number of cycles before a time of inputting a bank active command; and (b) switching control means for switching over between first and second modes;

(b1) in the first mode. the switching control means immediately activating a selected word line at the time of inputting the bank active command if the pre-charge command is input the pre-set number of clock cycles before the time of inputting of the bank active command, to shorten a row address strobe/column address strobe delay period, termed as "RAS/CAS delay period", tRCD as from the time of inputting the bank active command until the inputting of the read command; and (b2) in the second mode. the switching control means activating a selected word line with a pre-set delay time as from the time of inputting of the bank active command if the pre-charging command is input the pre-set number of clock cycles before the time of inputting the bank active command, to elongate the RAS/CAS delay period tRCD as from the time of inputting the bank active command until the inputting of the read command.

According to a 16th aspect, the clock synchronization semiconductor memory device comprises:

(a) a command decoder that decodes a command from a combination of control signals;

(b) an internal row address strobe signal generating circuit that generates an internal row address strobe signal responsive to inputting a pre-charge signal output by the command decoder and a band active signal; and (c) a word line timing adjustment circuit that generates and outputs a word line strobe control signal for controlling the strobe timing of a word line responsive to inputting of the row address strobe signal;

(d) a selected word line being set to an active state on transition from an inactive to an active of the word line strobe control signal;

wherein (cc) the word line timing adjustment circuit comprises:

(c1) a delay circuit that receives, as an input signal, the internal row address strobe signal and outputs the received input signal with a delay as an output signal;

(c2) a latch circuit that receives the internal row address strobe signal and outputs the internal row address strobe signal of a pre-set number of clock cycles before;

(c3) a first circuit that receives an output signal of the latch circuit and the output signal of the delay circuit to perform control responsive to a value of the internal row address strobe signal of a pre-set number of clock cycles before to permit passage of or mask of the internal row address strobe signal delayed by the delay circuit; and (c4) a second circuit that receives the internal row address strobe signal and an output of the first circuit, (i) if the internal row address strobe signal of a pre-set number of clock cycles before is active, the second circuit outputting, as the word line strobe control signal, a signal corresponding to the internal row address strobe signal, transition timing of which from an inactive to an active state is delayed a time equal to the delay time of the delay circuit from the transition timing from the inactive state to the active state of the internal row address strobe signal, so as to delay the transition from the inactive to the active of the word line, and (ii) if the internal row address strobe signal of a pre-set number of clock cycles before is inactive, the second circuit outputting, as the word line strobe control signal, a signal corresponding to the internal row address strobe signal, transition timing of which from the inactive to the active state is the same as the transition timing from the inactive state to the active state of the internal row address strobe signal so as not to delay the transition from the inactive to the active of the word line.

According to a 17th aspect, the clock synchronization semiconductor memory device comprises:

(a) a command decoder that decodes a command from a combination of control signals;

(b) an internal row address strobe signal generating circuit that generates an internal row address strobe signal responsive to inputting a pre-charge signal output by the command decoder and a bank active signal; and (c) a word line timing adjustment circuit that generates and outputs a word line strobe control signal for controlling strobe timing of a word line responsive to inputting of the row address strobe signal;

(d) a selected word line being set to an active state on transition from an inactive to an active state of the word line strobe control signal;

wherein (cc) the word line timing adjustment circuit comprises:

(c1) a first delay circuit that receives the internal row address strobe signal;

(c2) a first latch circuit that receives the internal row address strobe signal to latch the received signal with internal clock signals;

(c3) a second latch circuit that latches an output of the first latch circuit with the internal clock signals;

(c4) a first logic circuit that receives, as input signals, (i) an inversed signal obtained on inverting a delayed output signal of the first delay circuit via an inverter and (ii) an output signal of the second latch circuit, either
(i) to invertingly output the inversed signal received via the inverter from the first delay circuit, if an output signal of the second latch circuit is active, or
(ii) for the first logic circuit to output a fixed value to mask the inversed signal from the inverter if the output signal of the second latch circuit is inactive;

(c5) a second logic circuit that receives the internal row strobe signal output by the internal row address strobe signal generating circuit and an output signal of the first logic circuit, to output a NOR thereof;

(c6) a second logic circuit that receives an "output" of the second logic circuit and delays this "output" to issue the "delayed output"; and (c7) a third logic circuit that outputs a NOR of the output of the second logic circuit and the output of the second delay circuit.

BRIEF DESCRIPTION OF THE INVENTION

FIG. 16a and 16b illustrate the operation of a conventional clock synchronization semiconductor memory device.

PREFERRED EMBODIMENTS OF THE INVENTION

In the following, preferred embodiments of the present invention will be explained in detail. In the Preferred embodiments of the clock synchronization semiconductor memory device according to the present invention, the word line resetting timing is varied depending on whether or not a clock cycle prior to inputting of a pre-charging command, abbreviated to PRE-command, is the write operation, to enable an optimum write recovery time to be set for a memory cell.

Figure 1:
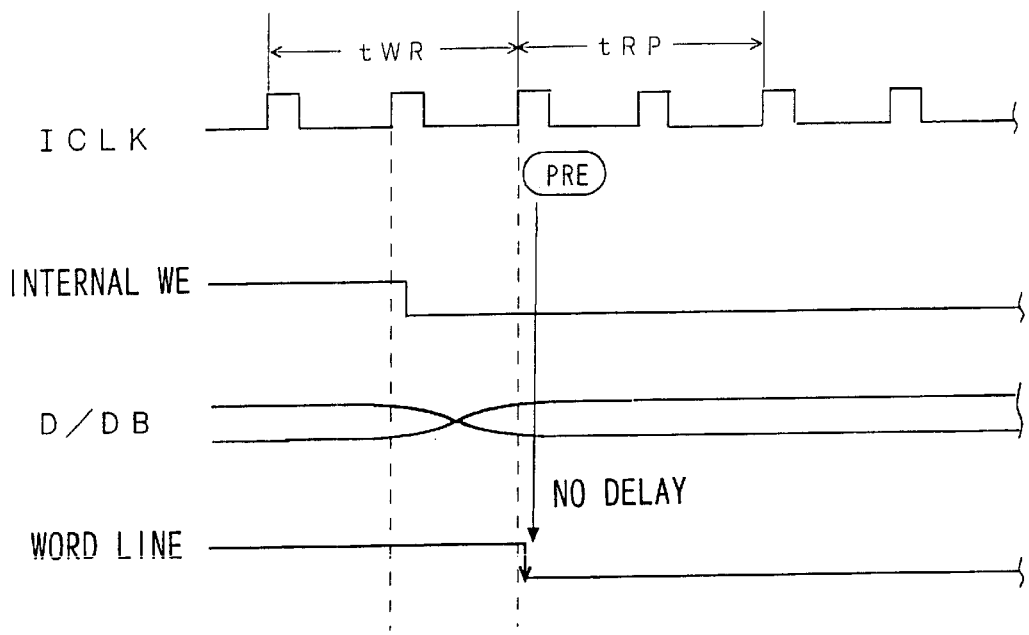
FIG. 1A and 1B illustrates the operating principle of an embodiment of the present invention.
Figure 1:
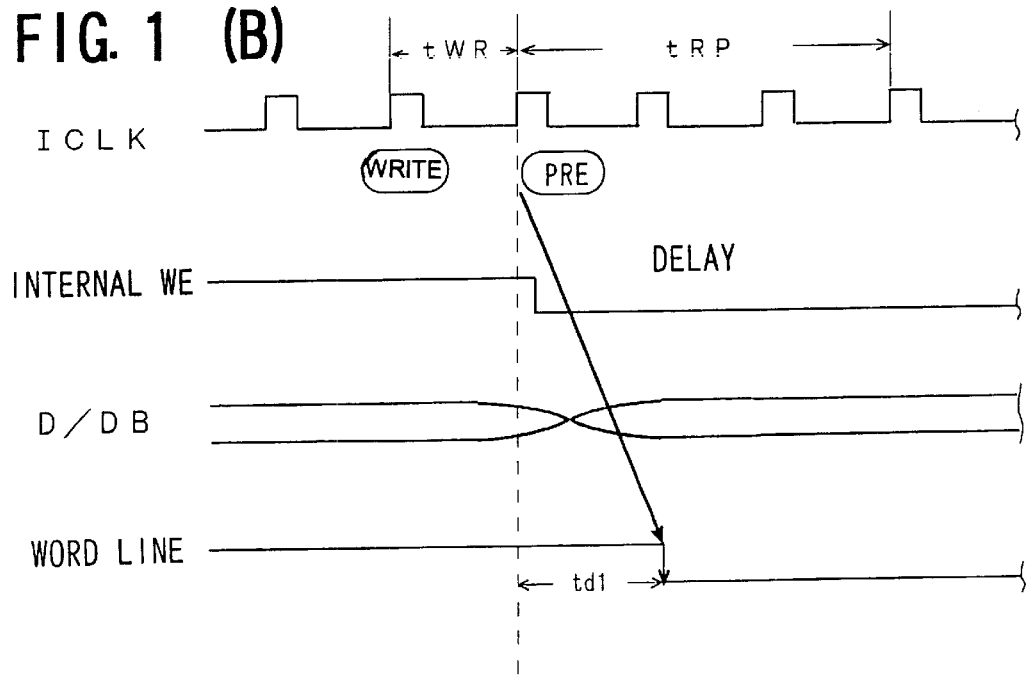

FIG. 1 shows a timing diagram for illustrating the operating principle of a clock synchronization semiconductor memory device according to an embodiment of the present invention. In FIG. 1, ICLK is an internal clock signal, "internal WE" is an internal write-enable signal and D/DB is a digit line pair of a memory cell array. The "write recovery time tWR" means a clock cycle from a clock of the last write time until inputting of the PRE-command.

If a PRE-command is input with a write recovery time tWR of two clock cycles or not less than two clock cycles, as shown in FIG. 1A, the clock cycle prior to a PRE-command input cycle is not the write operation (the internal write enable signal WE is inactive, i. e. , at Low level), and the writing in the memory cell is substantially at a close at the PRE-command inputting time point. Therefore, the decay (falling down) from the High level to the Low level of the word line can be quicker. That is, a sufficient write recovery time is guaranteed so that there is no necessity of delaying the word line resetting timing further from the inputting of the PRE-command. This allows shortening the pre-charging period of time tRP to two clock cycles, to increase the speed.

On the other hand, with a write recovery time tWR of one clock cycle, as shown in FIG. 1B, the write operation in the memory cell is not completed before the inputting of the PRE-command, so that delay time td1 is provided as from the PRE-command input time point until the decay of the word line to the Low level. Although 3 clock cycles are needed for the pre-charging period tRP, the write recovery time tWR of one clock cycle suffices.

Figure 2:
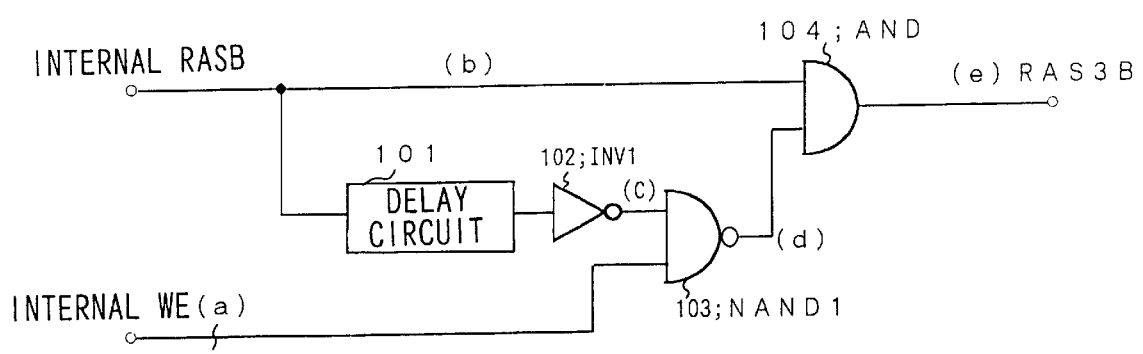
FIG. 2 illustrates the structure of the embodiment.

FIG. 2 shows the structure of a word line timing adjustment circuit according to an embodiment of the present invention. This word line timing adjustment circuit corresponds to the word line timing adjustment circuit 16A of FIG. 5 to which reference is made subsequently in the explanation of preferred embodiments of the present invention.

Referring to FIG. 2, this word line timing adjustment circuit is fed with an internal row address strobe signal, called an internal RASB signal, being output by an internal row address strobe signal generating circuit, called an "internal PRSB signal generating circuit", adapted for being fed with a pre-charging (PRE) signal, being output by a command decoder and decoding a command from the combination of control signals, and with a bank active signal (ACT), to generate an internal row address strobe signal (internal RASB signal), to control the active/inactive strobe timing of the word line. Meanwhile, the RASB 3 signal is a row active signal. If this signal goes to a High level (inactive state), the row address is reset to reset the word line from the X-decoder.

Referring to FIG. 2, the word line timing adjustment circuit includes a delay circuit 101, fed with the internal RASB signal, a NAND circuit 103 taking a negative logical product of an input signal corresponding to an output signal of the delay circuit 101 complemented by an inverter (INV1) 102 and with an input internal write enable signal WE, and an AND circuit 104 taking a logical sum of an input RASB signal RAB from the internal RASB signal generating circuit and an input signal which is an output signal of the NAND circuit 103.

Figure 3:
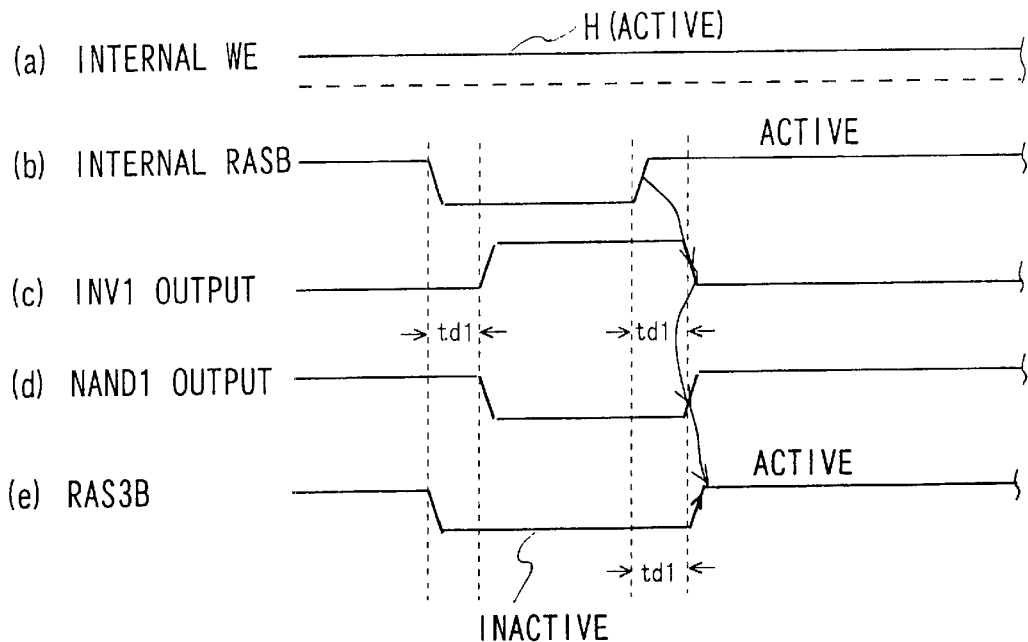
FIG. 3 is a timing diagram for illustrating the operation of the embodiment.
Figure 4:
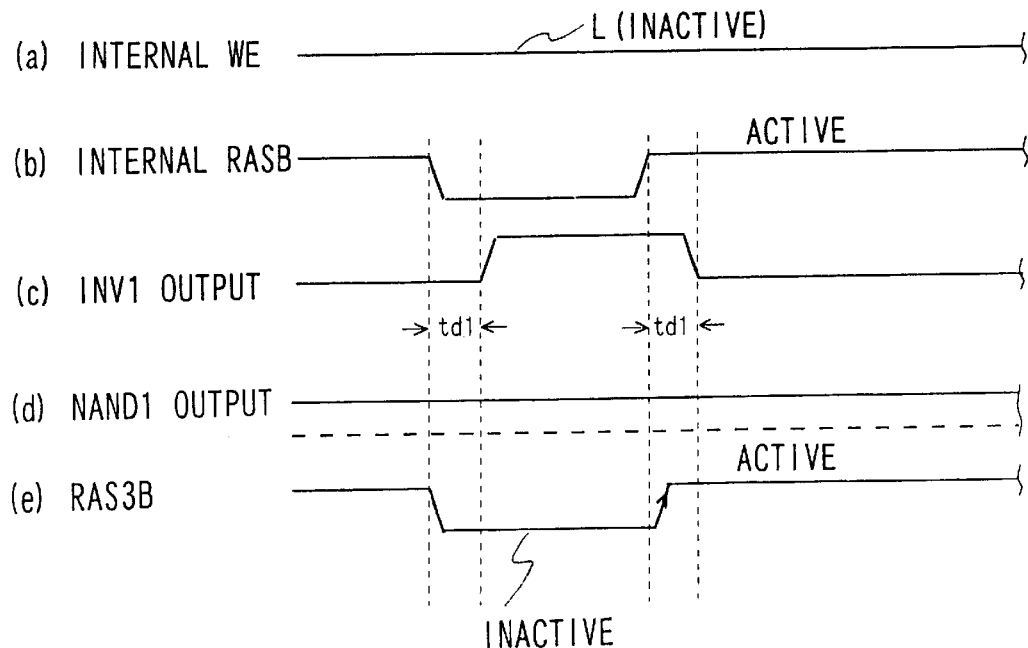
FIG. 4 is a timing diagram for illustrating the operation of the embodiment.

In FIGS. 3 and 4 showing timing diagrams for illustrating the operation of the circuit shown in FIG. 2, (a), (b) , (c) , (d) and (e) denote signal waveforms of an internal write enable signal WE ("Internal WE"), an internal RASB signal, an output of the inverter INV1, an output of the NAND1 circuit 103 and an output (RAS3B) of the AND circuit 104, respectively.

If the value of the internal write enable signal WE is active at the PRE-command inputting time point, a transition edge from the active level (Low level) to the inactive level (High level) of the RAS3B signal is delayed a time equal to the delay time td1 of the delay circuit 101 from the timing of a transition edge from the active (Low level) to the inactive level (High level) of the internal RASB signal, as shown in FIG. 3.

On the other hand, if, at the PRE command input timing, the value of the internal write enable signal WE is inactive level (Low level), the transition edge (H to L) from the active level to the inactive level of the RAS3B signal and that (L to H) from the inactive level to the active level are switched over so as to be of the same timing as the transition edge (H to L) from the active level to the inactive level and that (L to H) from the inactive level to the active level of the internal RASB signal, as shown in FIG. 4.

According to the present invention, the write recovery time period tWR=two clocks with pre-charging period tRP= two clocks (first mode) and the write recovery time Period tWR=one clock with the pre-charging period tRP=three clocks (second mode) are realized by a sole chip species to enable tWR/tRP control in meeting with the chip set used.

Also, according to the present invention, the arrangement may be made so that, if, in a clock cycle directly previous to the PRE-command inputting time point, the write burst signal (WBST) is active and is not masked by a data mask signal (DQM), the delay circuit is exploited and, if otherwise, the delay circuit path is skipped to reset the word line.

Thus, according to the present invention, the word line resetting timing may be changed (i.e., controlled) to set an optimum write recovery time to the memory cell depending on whether or not the clock cycle previous to the PRE command inputting cycle is in a write operation, that is whether the PRE-command has been input with a tWR equal to one clock or whether the PRE-command has been input with a tWR equal to two or more clocks.

Figure 9:
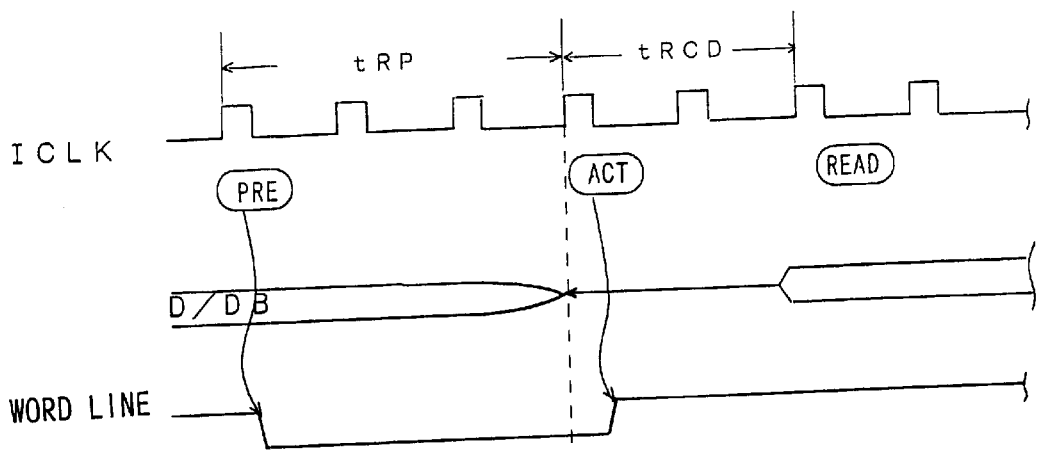
FIG. 9A and 9B are timing diagram for illustrating the operation of a second embodiment.
Figure 9:
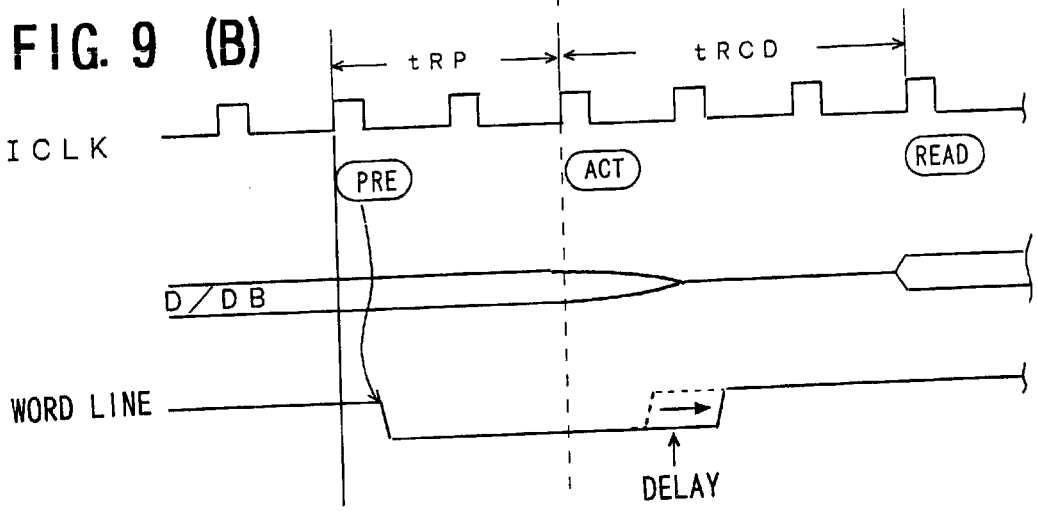

A second embodiment of the present invention is now explained. FIG. 9 shows a timing diagram for illustrating the second embodiment of the present invention. In the present second embodiment, the state of the internal RASB signal two clocks before is monitored to verify whether or not a PRE-command has been input at a time point, by a predetermined clock cycle or cycles (two clock cycles in the example shown in FIG. 9), before the time Point of inputting of a bank active command (ACT command), that is whether or not the pre-charging period tRP is longer than the two clock cycles. If tRP is longer than the predetermined clock cycle(s), the transition edge from the Low level to the High level of the internal RAS signal at the time of inputting of the ACT command, that is the timing of activating the word line, is quickened to shorten tRCD since the time of inputting the ACT command until the time of inputting the READ command (RAS/CAS delay period) by two clock cycles in FIG. 9 as shown in FIG. 9A. On the other hand, if the pre-charging period tRP is equal to the above-mentioned pre-set clock cycle(s), there is provided a delay in the transition edge from the Low level to the High level of the internal RASB signal at the time of inputting the ACT command, that is the timing of activating the word line, to elongate tRCD since the time of inputting the ACT command until the time of inputting the READ command (RAS/CAS delay period) to a predetermined number of clock cycles (three clock cycles in FIG. 9) as shown in FIG. 9B.

DETAILED DESCRIPTION OF THE PREFERRED EMBODIMENTS

Figure 5:
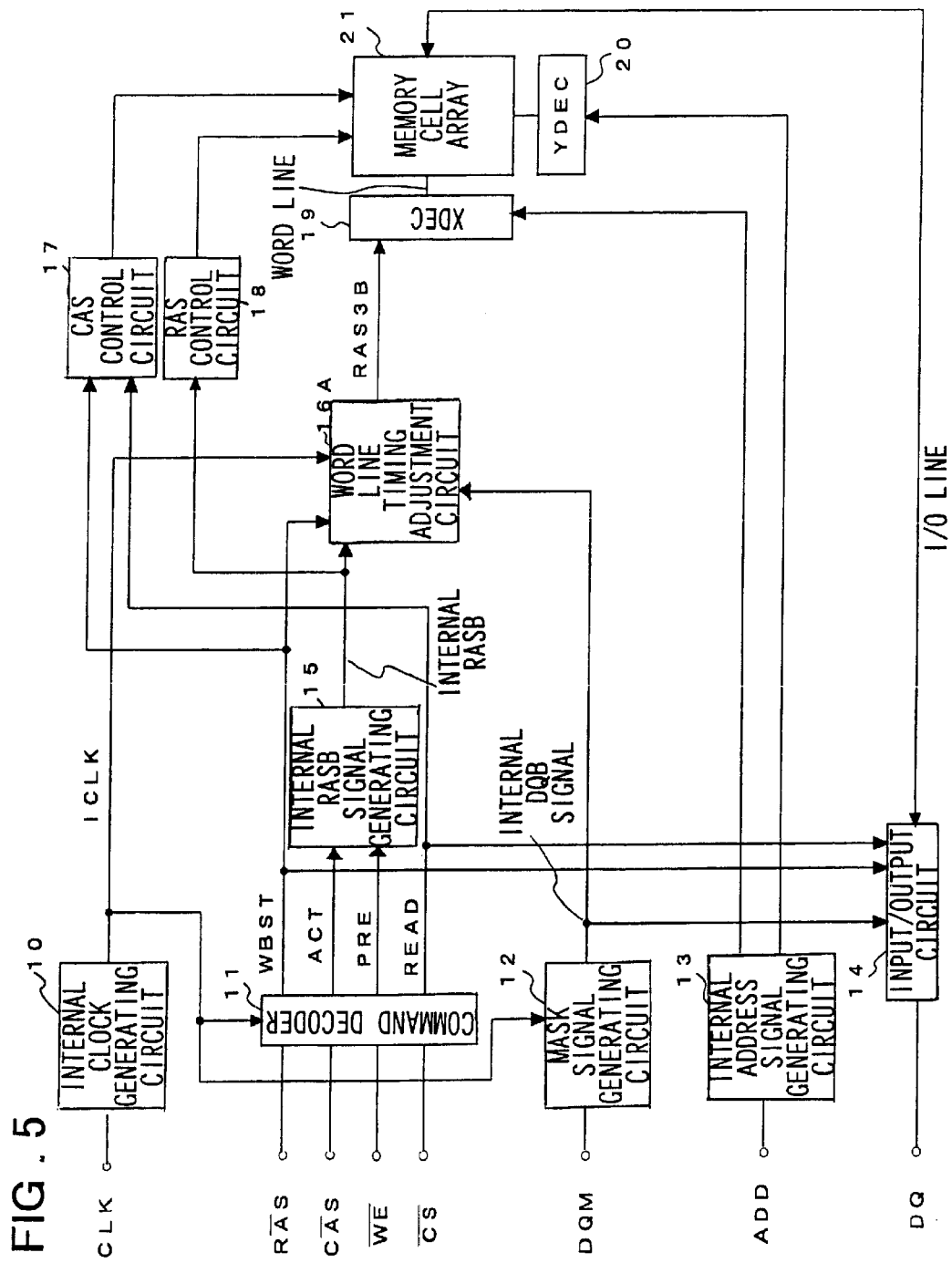
FIG. 5 shows the structure of a clock synchronization semiconductor memory device according to an embodiment of the present invention.

For more detailed explanation of the above-described embodiment of the present invention, a preferred embodiment of the present invention is explained with reference to the drawings. In FIG. 5, showing a structure of one embodiment of a clock synchronization type semiconductor memory device embodying the present invention, the same or similar parts or components as those of the conventional clock synchronization type semiconductor memory device shown in FIG. 13 are denoted by the same reference numerals.

Figure 13:
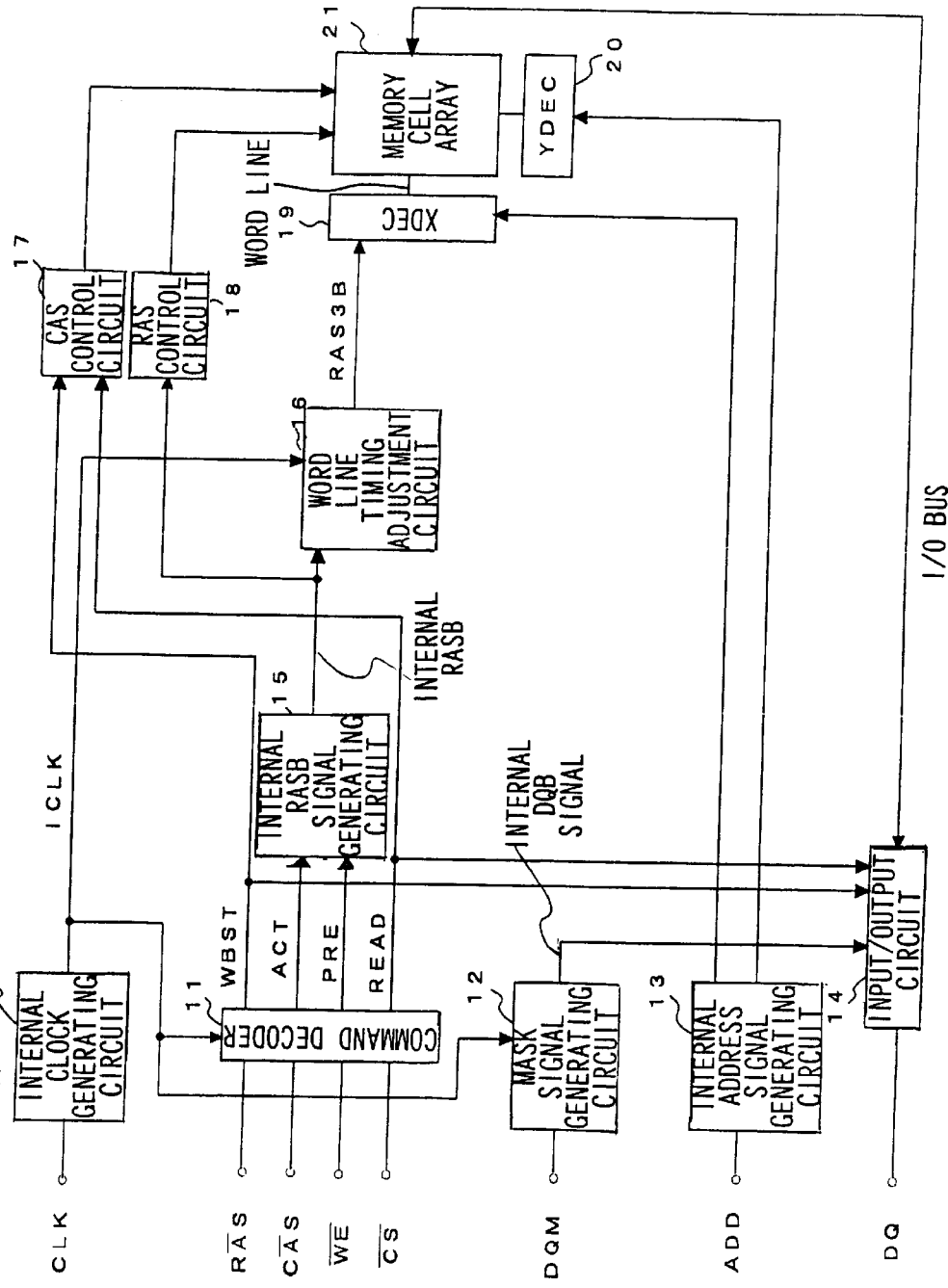
FIG. 13 shows the structure of a conventional clock synchronization semiconductor memory device.
Figure 14:
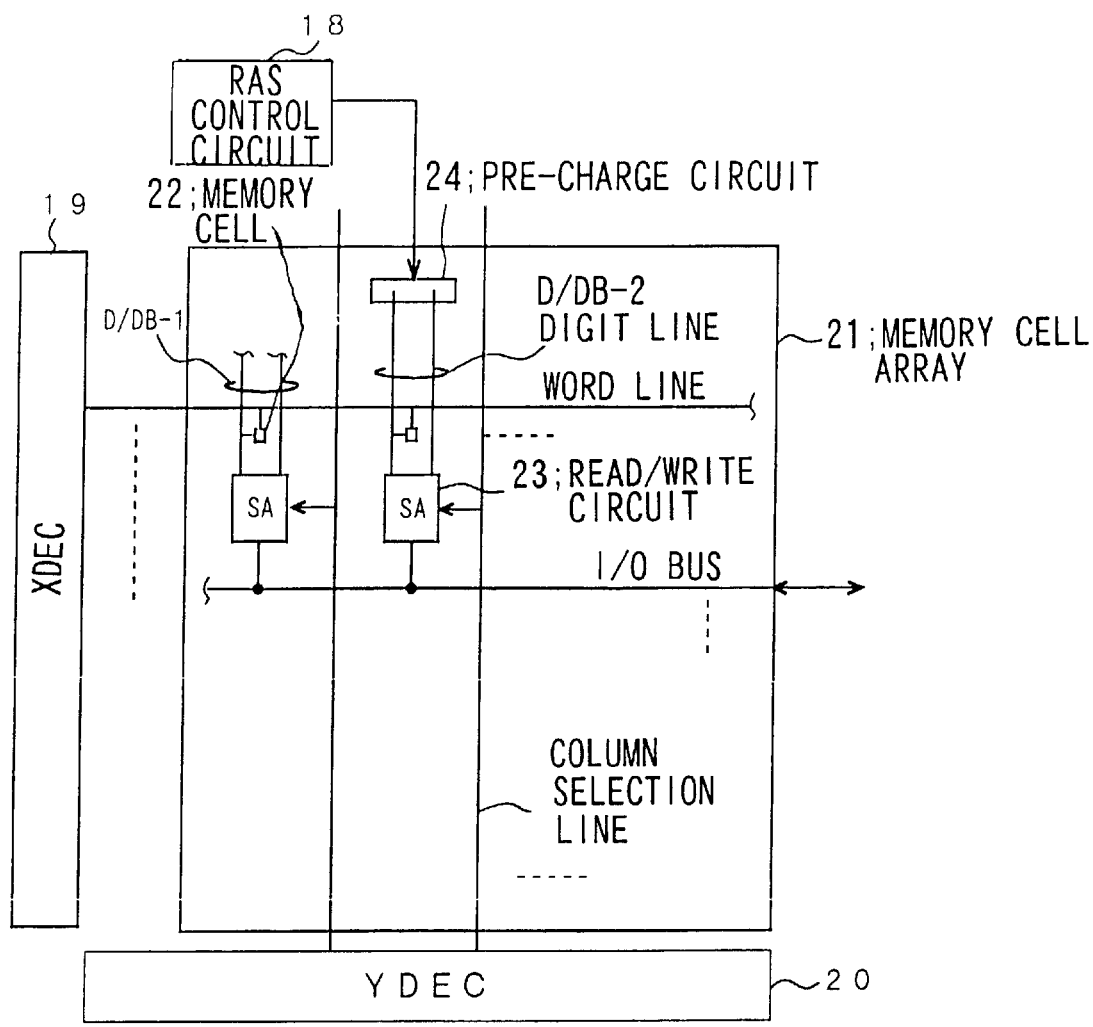
FIG. 14 shows the structure of a memory cell array of the conventional clock synchronization semiconductor memory device.
Figure 15:
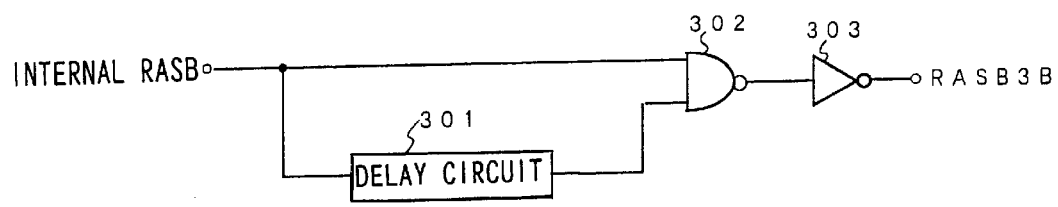
FIG. 15 shows the structure of a word line timing adjustment circuit of a conventional clock synchronization semiconductor memory device.

Referring to FIG. 5, the preferred embodiment of the present invention shown therein differs from the conventional clock synchronization type semiconductor memory device shown in FIG. 13 in that the word line timing adjustment circuit 16A, fed with an internal RASB signal being output by the internal RASB signal generating circuit 15 to generate RASB3 is fed not only with the internal RASB signal and the internal clock ICLK but also with a write burst signal (WBST) from the command decoder 11, and a DQM signal from the mask signal generating circuit 12. The internal RASB signal generating circuit 15 is fed with the pre-charge signal (PRE) output by the command decoder 11 decoding the command from the combination of control signals and with the bank active signal to generate the internal RASB signal.

Figure 6:
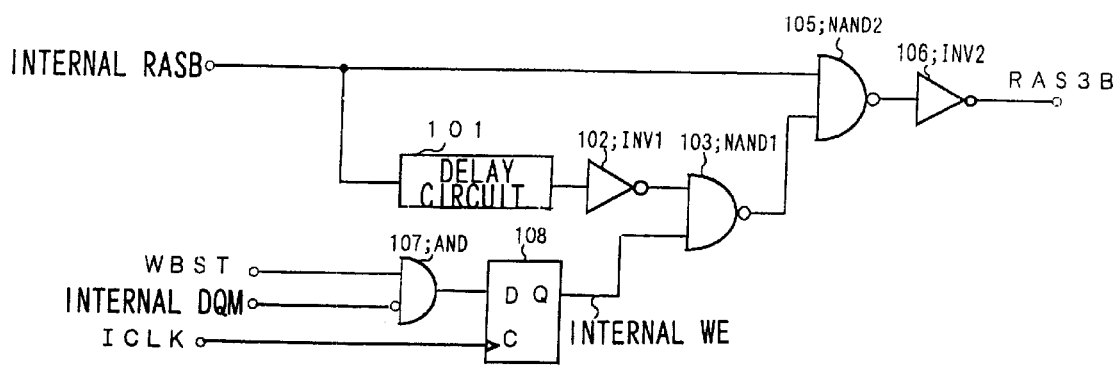
FIG. 6 shows the structure of a word line timing adjustment circuit according to an embodiment of the present invention.

FIG. 6 shows the structure of the word line timing adjustment circuit 16A according to an embodiment of the present invention. Referring to FIG. 6, the word line timing adjustment circuit 16A includes a delay circuit 101, fed with the internal RASB signal, a first inverter circuit (INV1) 102 for inverting the output of the delay circuit 101, an AND circuit 107 fed with a write burst signal WBST, and a data mask signal DQM with inversion (negative logic), a D-flipflop 108 fed with an output (called an internal write enable signal WE) of the AND circuit 107 at its data input terminal (D) and with an internal clock ICLK at its clock input terminal (C), a first NAND circuit 103 fed with an output of the first inverter circuit (INV1) 102 and with an output of the D-flipflop 108, a second NAND circuit (NAND2) 105 fed with an internal RASB signal output by the internal RASB signal generating circuit 15 and with an output of the first NAND circuit (NAND1) 103, and a second inverter (INV2) 106 for inverting the output of the second NAND circuit 105.

If the write burst signal WBST is active (at the High level) and the data mask signal DQM is inactive (at the Low level), meaning that the input data is not masked, the AND circuit 107 outputs a High level, with the D-flipflop 108 outputting and holding an active signal in synchronism with the internal clock (ICLK).

When the output of the D-flipflop 108 (internal write enable signal WE) is at the High level, the first NAND circuit 103 inverses the signal from the first inverter 102 to output an inversed signal thereof.

That is, if the value of the internal write enable signal WE is at the High level, the rise timing from the Low level to the High level of the RAS3B is set so as to be a timing delayed from the rise timing from the Low level to the High level of RASB by a delay time tdl of the delay circuit 101, as shown in FIG. 3.

On the other hand, if the output signal of the D-flipflop 108 (internal write enable signal WE) is at the Low level, the first NAND circuit 103 outputs a high level to mask the signal from the first inverter 102. At this time, the second NAND circuit 105 inverses the input internal RASB signal to output the inversed signal. The second inverter 106 directly outputs the internal RASB signal without delaying its rising edge, as shown in FIG. 4.

Figure 7:
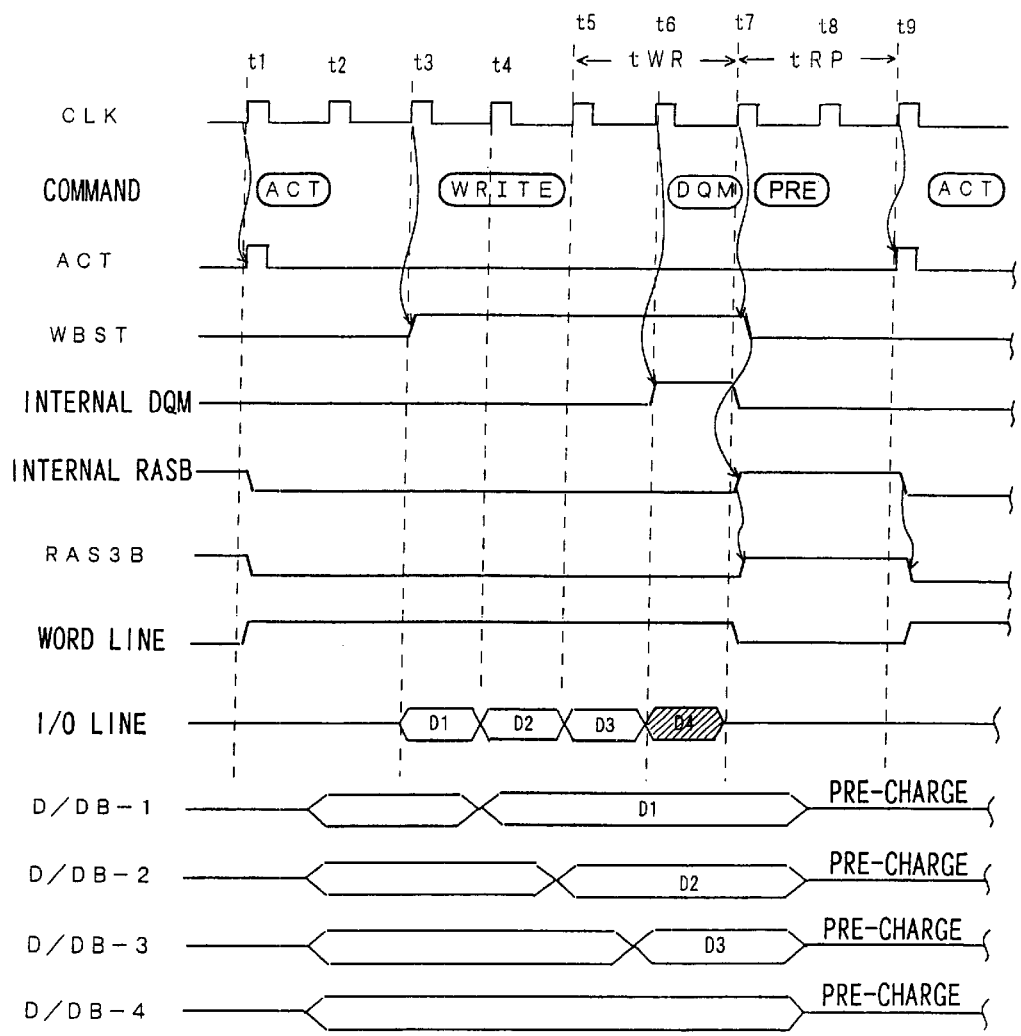
FIG. 7 is a timing diagram for illustrating the operation of the embodiment of the present invention.
Figure 8:
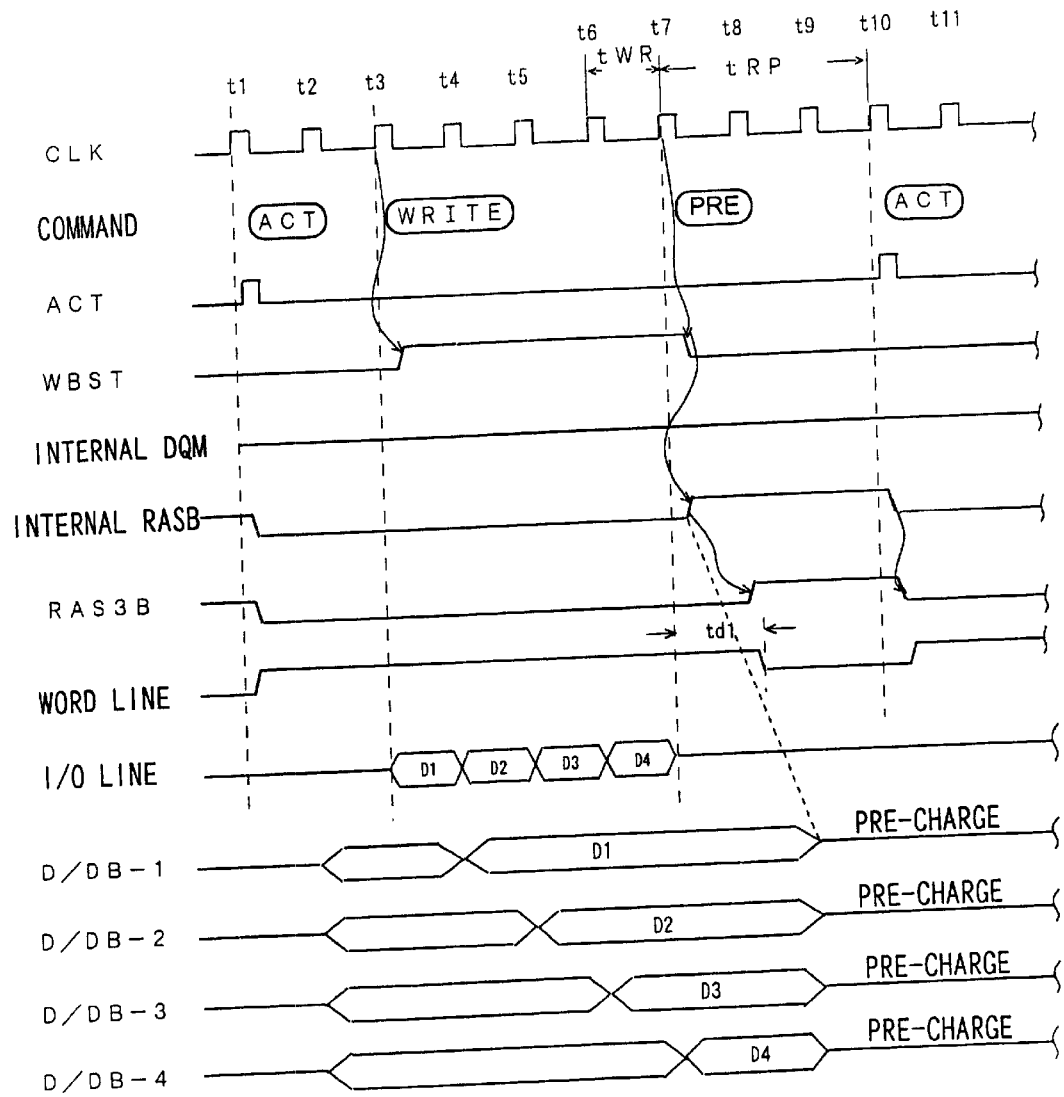
FIG. 8 is a timing diagram for illustrating the operation of the embodiment of the present invention.

FIGS. 7 and 8 show timing diagrams for illustrating the operation of a semiconductor memory device of the preferred embodiment of the present invention, explained in connection with FIGS. 5 and 6.

Referring to FIG. 7, the write (WRITE) command is input after inputting the ACT command to effect burst writing with a burst length 4. The fourth bit data D4 is masked by an activated internal DQM signal. That is, the internal write enable signal WE is rendered inactive (goes to the Low level) based on logical value of the DQM signal at a time point and the WBST signal one clock cycle before the PRE-command inputting timing, such that the word line timing adjustment circuit 16A switches the transition edge of the RAS3B signal from the active to the inactive and that from the inactive to the active so that each of the transition edges will be of the same timing as the transition edge of RASB from the active to the inactive and from the inactive to the active.

As a result there is no delay time as from the PRE-command input timing until the word line resetting, as shown in the clock cycle beginning as from time point t7 in FIG. 7, with the pre-charging period tRP being of two clock cycles.

Referring to FIGS. 7, 5 and 6, the data writing operation in the semiconductor memory device according to the preferred embodiment of the present invention is explained. If the external clock CLK rises at time t1, the command decoder 11 decodes the input control signal to cause the ACT signal to assert itself. The internal RASB signal generating circuit 15 is responsive thereto to set the internal RASB signal to the Low level. The RAS3B signal, being output by the word line timing adjustment circuit 16A, also goes to the Low level. A row address ADD is captured to the internal address signal generating circuit 13 at a falling edge of the internal RASB signal. The internal address signal generating circuit 13 supplies the row address signal to the X-decoder 19. The X-decoder 19 decodes the row address signal to select one of plural word lines to cause the potential of the selected word line to switch from the Low level to the High level. The X-decoder holds the potential of the non-selected word lines at the Low level.

When the pre-charging is removed at time t2, writing data to a memory cell, connected to the selected word line, is output to digit line pairs (D/DB).

If a write (WRITE) command is input at time t3 to the command decoder 11, the command decoder sets the write burst signal to the High level. The column address signal ADD is input to the internal address signal generating circuit 13. The column address ADD is supplied to the Y-decoder 20 and decoded to select a set of plural digit line pairs. When the write data D1 is input from the data input/output terminal to the input/output circuit 14, the latter outputs data D1 to the I/O line.

At time t4, a write data D1 is sent to the selected digit line pair DB/DB_1 so that data is written in a memory cell connecting to the selected word line. Simultaneously, the internal address signal generating circuit 13 increments the column address to supply the column address signal to be selected next to the Y-decoder 20. The input/output circuit 14 retrieves a next write data D2 input from the data input/output (DQ) terminal to output a data D2 to the I/O line.

At time t5, data D3 is output to the I/O line, as at time t4.

At time t6, the mask signal generating circuit 12 captures a mask signal from the DQM terminal to set the internal DQM signal to the High level. If the internal DQM signal is at the High level, the input/output circuit 14 masks the write data D4 input from outside, so that no data is output to the I/O line, as shown shaded with the timing signal in the I/O line in FIG. 7, with the digit D/DB_4 not being changed.

At time t7, a PRE-command is input to reset the write burst signal WBST and the internal RASB and RAS3B, with the word lines being in non-selected state.

If, as shown in FIG. 8, the ACT command is input at time t, the write (WRITE) command is input at time t3, such that burst writing is effected with a burst length equal to four clock cycles, the internal write enable signal WE turns to the active (High level) based on the WBST signal and logical value (Low level) of the internal DQM signal at a time Point one clock cycle before the PRE-command inputting time point (time t7), that is at time t6. The transition edge of the RAS3B signal from the Low level to the High level is set so as to be of a timing delayed by a delay time td1 of the delay circuit 101 from the timing of the transition edge of the internal RASB signal from the Low level to the High level, so that the delay time td1 is introduced since the inputting of the PRE-command at time t7 until the word line resetting, as a result of which the pre-charging period tRP assumes the three-clock cycles.

Meanwhile, in the timing chart shown in FIG. 7, the internal DQM signal is at a High level at time t6 during one clock cycle, so that the input data d4 is not written in the memory cell. In the example shown in FIG. 8, the internal DQM signal is maintained at the Low level, so that the writing data D1 to D4 are fed to the digit line pairs DB/DB_1 to DB/DB_4, respectively, in keeping with burst write with a burst length of 4 clock cycles.

A second embodiment of the present invention is now explained with reference to FIG. 9. In the present second embodiment, the state of the internal RASB signal at a time point two clocks before is monitored to verify whether or not the PRE-command has been input two clock cycles before inputting of the ACT command, that is whether or not the pre-charging period tRP is longer than two clock cycles. If tRP is longer than the two clock cycles, the transition edge of the internal RAS signal from the Low level to the High level at the time point of inputting of the ACT command, that is the timing of activating the word line, is quickened to shorten tRCD (RAS/CAS delay period) since the time of inputting the ACT command until the time of inputting a READ command to two clock cycles, as shown in FIG. 9A. On the other hand, if the pre-charging period tRP is of two clock cycles, there is provided a delay in the transition edge of the internal RASB from the Low level to the High level signal at the time of inputting the ACT command, that is the timing of activating the word line, to switch over the tRCD (RAS/CAS delay period) since the time of inputting the ACT command until the time of inputting the READ command to three clock cycles, as shown in FIG. 9B.

Figure 10:
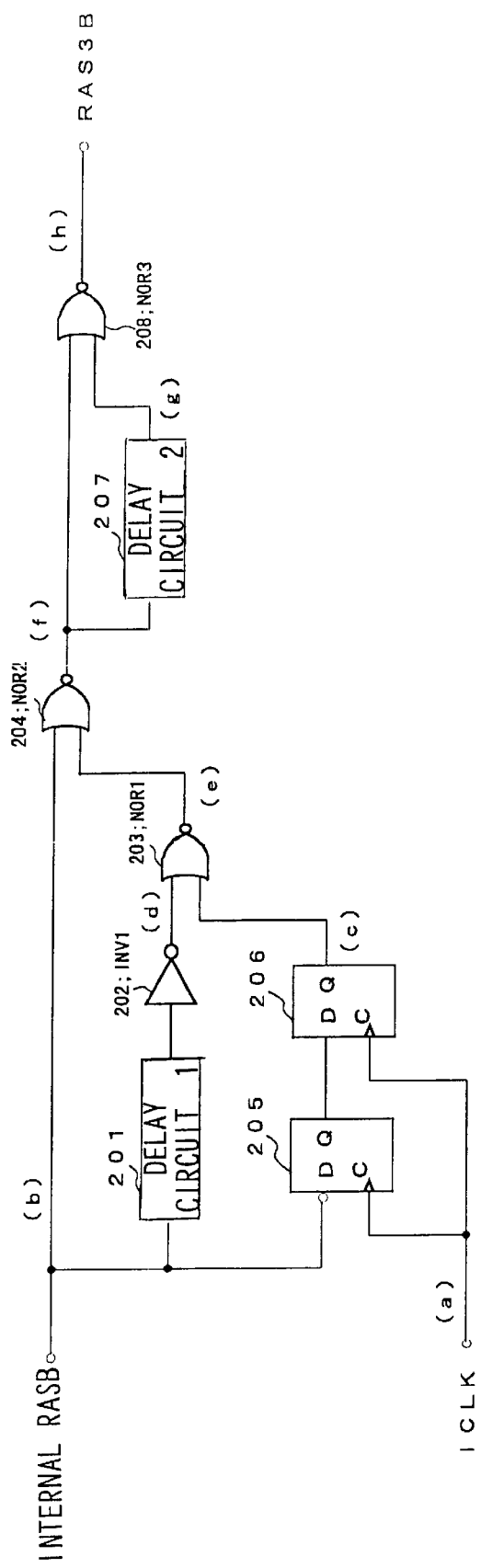
FIG. 10 shows the structure of a word line timing adjustment circuit according to the second embodiment of the present invention.

FIG. 10 shows an example of the structure of a word line timing adjustment circuit according to the second embodiment of the present invention. In the present second embodiment, the configuration of the clock synchronization semiconductor memory device is in general similar to that shown in FIG. 5. However, the word line timing adjustment circuit does not use (receive) the WBST signal nor the DQM signal, and is fed with the RASB signal and the internal clock signal ICLK.

Referring to FIG. 10, the word line timing adjustment circuit of the present second embodiment includes a delay circuit (1) 201 for inputting the internal RASB signal, a first inverter circuit (INV1) 202 for inverting an output of the delay circuit 201, a first D-flipflop 205, the data input terminal (D) and the clock input terminal (C) of which are fed with the internal RASB signal and with internal clocks ICLK, respectively, and a second D-flipflop 206, the data input terminal (D) and the clock input terminal (C) of which are fed with an output of the first D-flipflop 205 and internal clocks ICLK, respectively. The word line timing adjustment circuit also includes a first NOR circuit (NOR) 203 fed with an output of the first inverter 202 and an output of the second D-flipflop 206; and a second NOR circuit (NOR2) 204 fed with an internal row address strobe (RASB) signal and an output of the first NOR circuit 203. The word line timing adjustment circuit also includes a second delay circuit (2) 207 for delaying an output of the second NOR circuit 204; and a third NOR circuit (NOR3) 208 fed with an output of the second NOR circuit 204 and with an output of the second delay circuit 207. The RAS3B signal is output at the third NOR circuit 208.

The second NOR circuit (NOR2) 204 outputs the internal RASB signal either directly or with a delay of its rising edge corresponding to a delay time td1 of the delay circuit 201. The third NOR circuit (NOR3) 208 issues an output of the second NOR circuit 204 with a delay of its rising edge corresponding to a delay time td2 of the second delay circuit (2) 207.

Figure 11:
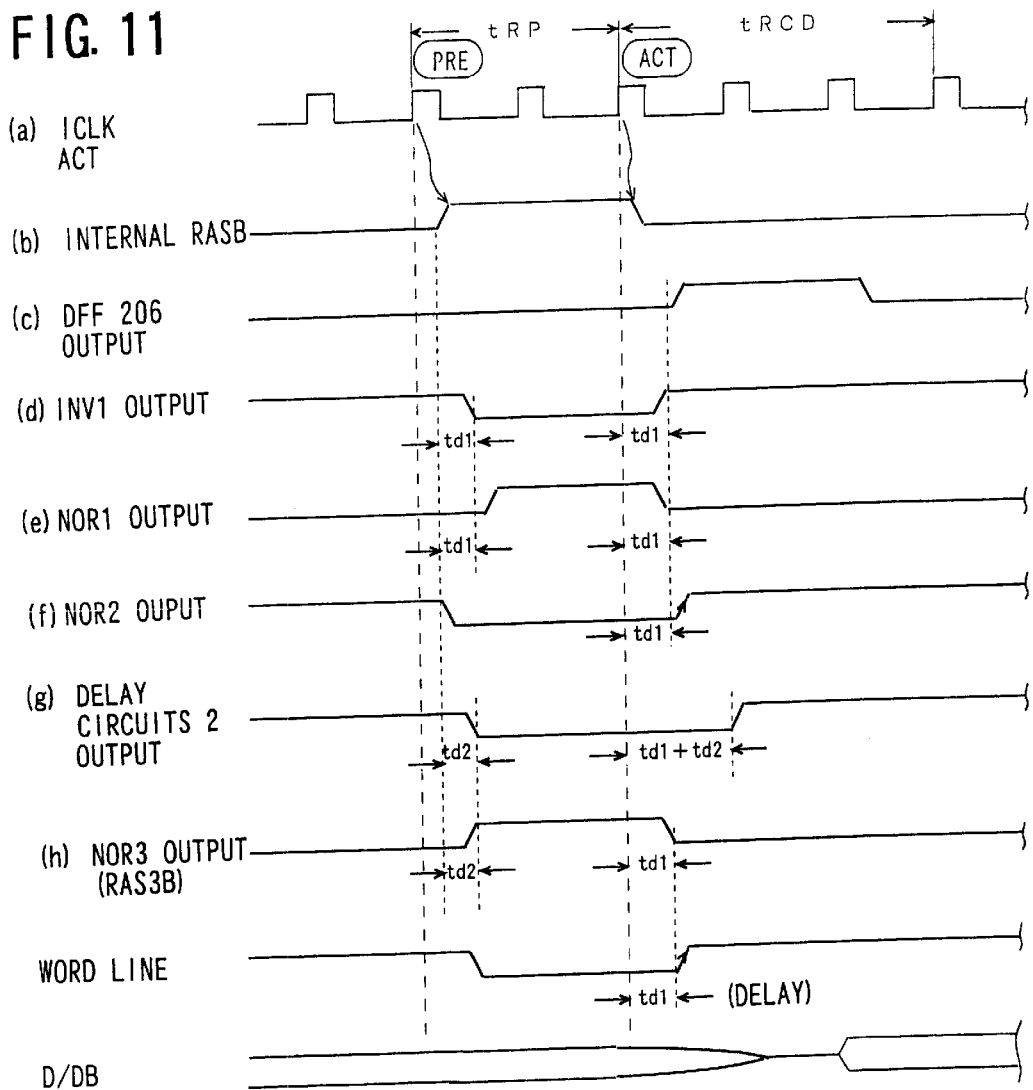
FIG. 11 is a timing diagram for illustrating the operation of the second embodiment.
Figure 12:
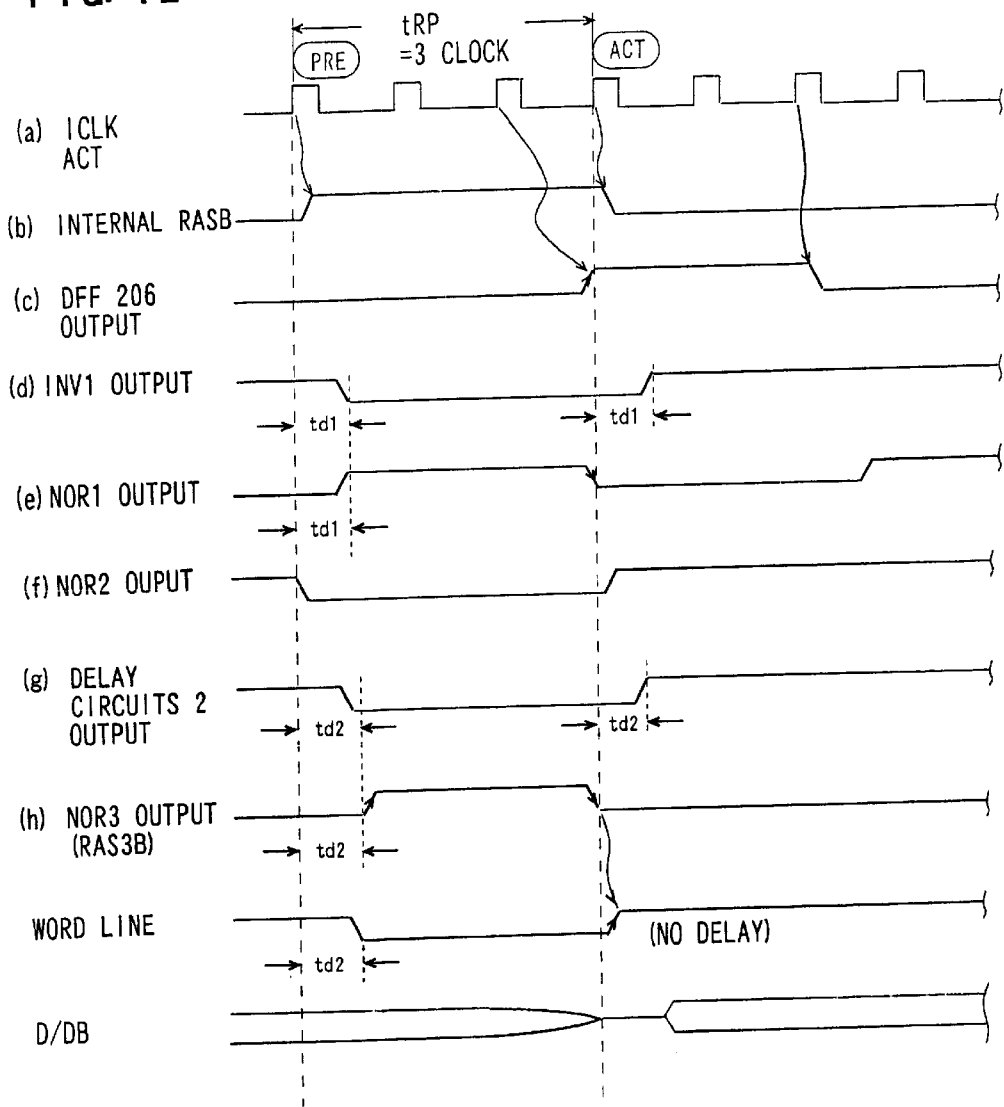
FIG. 12 is a timing diagram for illustrating the operation of the second embodiment.

FIGS. 11 and 12 illustrate the structure of the clock synchronization semiconductor memory device of the second embodiment of the present invention. In FIG. 11, (a), (b), (c), (d), (e) and (f) denote signal waveforms of internal clocks ICLK, internal RASB signal, an output of the second D-flipflop 206 of the word line timing adjustment circuit, an output of the first inverter 202, an output of the first NOR circuit 203 and an output of the second NOR circuit 204, respectively. In addition, data line pairs D/DB of the word lines and digit lines are shown.

Referring to FIGS. 10 and 11, a case in which a PRE-command is input two clock cycles before the ACT inputting time point is explained.

By the inputting of the PRE-command, the internal RASB signal is inactive (High) to reset the word line. At a time point when subsequently the ACT command is input, an output of the second D-flipflop 206, which latches and outputs the state of the internal RASB signal two clock cycles before is at the Low level. The first NOR circuit (NOR1) 203 outputs a signal corresponding to the internal RAS signal delayed by a delay time td1 to the second NOR circuit (NOR2) 204, which then outputs a signal the rising edge from the Low to the High of which is delayed by td1 from the RASB signal. This delays the falling edge of the RAS3B signal from the High to the Low by td1 as from the ACT command inputting time. The selected word line is active with a delay of td1 as from the ACT command input time, with the tRAS/CAS delay time (tRCD) being three clock cycles. Meanwhile, there is further provided a delay time of td2 by the delay circuit 207 as from the PRE-command inputting time command until the time of word line resetting.

If the PRE-command has already been input at a time point more than two clock cycles before the time of inputting of the ACT command, an output of the second D-flipflop, latching and outputting the state of the internal RASB signal two clocks before, is at a High level at the time of inputting of the ACT command. The first NOR circuit (NORL) 203, outputs a signal having a rising edge delayed from the rising edge of the internal RASB signal by a delay time td1, and its falling edge simultaneous with the timing of the falling edge of the internal RASB. The second NOR circuit (NOR2) 204 is responsive to this signal to output a signal (inverted) of the same timings as the falling edge and the rising edge of the internal RASB signal. As a result, the falling edge from the High to the Low level of the RAS3B signal output from the third NOR circuit 208 is not delayed as from the ACT command input timing, such that the word line turned on active immediately when the ACT command is input, with the tRAS/CAS delay time being two clock cycles. Meanwhile, a delay time td2 is provided as from the PRE-command inputting until word line resetting.

Of course, the clock synchronization semiconductor memory device of the present invention may be provided with both the word line timing adjustment circuits of the first and second embodiments.

The present invention is also not limited to the configuration in which the RAS3B signal controlling the word line strobe timing is active at the Low level, that is, the present invention is not limited to the configuration of the logic circuit of the above-described embodiment provided that the configuration allows for variable control of the delay of the transition edge(s) of the required signal.

Moreover, in the present invention, the configuration of latching the values of the WBST and DQM signals is not limited to the one-stage configuration, as in the above-described embodiment. In similar manner, the flipflop used for latching the internal RASB signal is not limited to the two-stage configuration.

Of course, the verification as to whether or not the cycle prior to the inputting time of the PRE-charge command is the write operation is valid not only for the burst write operation but also for the single write operation.

The meritorious effects of the present invent ion are summarized as follows.

As described above, the Present invention gives a meritorious effect that the pre-charge period tRP can be quickened by speeding the timing of word line falling timing as from the PRE-command in case where the write recovery period of time tWR is of two clock cycles.

Also, according to the present invention in which it is verified whether or not the cycle before the inputting of the PRE-command is the write operation, and in which the word line falling timing after the PRE-command is advanced or delayed, if the cycle before the inputting of the PRE-command is not or is the write operation, respectively. Thereby it is possible to realize both the design parameters of the write recovery period tWR two clocks and the pre-charging period tRP=1 clock and the design Parameters of the write recovery period tWR=one clock and the pre-charging period tRP=3 clocks with a chip product of a sole species.

Moreover, with the present invention, the read CAS/RAS delay time can be quickened by monitoring the internal RASB (row address strobe) signal, verifying whether or not the pre-charge period tRP at the time of ACT command input is not less than a predetermined number of clock cycles and by activating the selected word line without delay from the time of the ACT command input if the pre-charging period tRP is not less than a pre-set clock cycle.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock synchronization semiconductor memory device comprising:
   a determination circuit that determines whether or not a clock cycle at least one clock cycle before the time point of inputting a pre-charge command was under a write operation, and
   a variable control circuit that variably controls a period of time as from a time point of inputting the pre-charge command until resetting of a word line based on outcome of said determination circuit.

2. A clock synchronization semiconductor memory device comprising:
   means for providing a pre-set delay time as from a time point of inputting a pre-charging command until resetting a word line, if a clock cycle at least one clock cycle before inputting a pre-charge command is under a write operation; and
   switching controlling means for resetting the word line immediately in case the clock cycle at least one clock cycle before inputting the pre-charge command is not under the write operation.

3. A clock synchronization semiconductor memory device comprising:
   a switching circuit that controls between introducing and not introducing a pre-set delay during the time as from a time point of inputting a pre-charge command until resetting of a word line, based on the state of an internal write enable signal during a clock cycle at least one clock cycle before inputting the pre-charge command.

4. A clock synchronization semiconductor memory device comprising:
   checking means for checking whether or not a clock cycle at least one clock cycle before inputting a pre-charge command corresponds to a write operation;
   means for storing results of said checking; and
   means for variably controlling a period of time as from a time point of inputting a pre-charge command until resetting of a word line, at the time point of the inputting of the pre-charge command, responsive to the checked results.

5. A clock synchronization semiconductor memory device comprising:
   checking means for checking whether or not a clock cycle at least one clock cycle before inputting a pre-charge command corresponds to a write operation and for storing results of checking;
   time-delay means for providing a pre-set delay time as from a time point of inputting a pre-charging command until resetting a word line if the results of check indicate that the clock cycle at least one clock cycle before inputting a pre-charge command corresponds to a write operation; and
   a switching controlling means for resetting the word line immediately in case the results of check indicate that the clock cycle at least one clock cycle before inputting a pre-charge command does not correspond to a write operation.

6. The clock synchronization semiconductor memory device as defined in claim 1 wherein
   said control is of said variable control circuit performed by switching over between first and second modes:
   (1) the first mode being performed if a clock cycle immediately before the inputting of a pre-charge command is not a write operation, such that a write recovery time period is switched to two clock cycles and a pre-charge period is switched to two clock cycles; and (2) the second mode being performed if a clock cycle immediately before the inputting of a pre-charge command is a write operation, such that the write recovery time period is switched to one clock cycle and the pre-charge period is switched to three clock cycles.

7. The clock synchronization semiconductor memory device as defined in claim 2 wherein control of said switching controlling means is performed by switching over between first and second modes:

(1) the first mode being performed if a clock cycle immediately before the inputting of a pre-charge command is not a write operation, such that a write recovery time period is switched to two clock cycles and a pre-charge period is switched to two clock cycles; and (2) the second mode being performed if a clock cycle immediately before the inputting of a pre-charge command is a write operation, such that the write recovery time period is switched to one clock cycle and the pre-charge period is switched to three clock cycles.

8. The clock synchronization semiconductor memory device as defined in claim 3 wherein said control of said switching circuit is performed by switching over between first and second modes:

(1) the first mode being performed if a clock cycle immediately before the inputting of a pre-charge command is not a write operation, such that a write recovery time period is switched to two clock cycles and a pre-charge period is switched to two clock cycles; and (2) the second mode being performed if a clock cycle immediately before the inputting of a pre-charge command is a write operation, such that the write recovery time period is switched to one clock cycle and the pre-charge period is switched to three clock cycles.

* * * * *